(12) United States Patent
Maruyama

(10) Patent No.: US 7,213,328 B2
(45) Date of Patent: May 8, 2007

(54) CONNECTOR MOUNTING SYSTEM

(75) Inventor: Shinichiro Maruyama, Yamato (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 11/325,717

(22) Filed: Jan. 5, 2006

(65) Prior Publication Data

US 2006/0189214 A1    Aug. 24, 2006

(30) Foreign Application Priority Data

Jan. 7, 2005    (JP)    ............................ 2005-002039

(51) Int. Cl.
*H05K 13/00* (2006.01)
(52) U.S. Cl. ........................ 29/760; 439/940
(58) Field of Classification Search ................ 439/135, 439/940; 29/760, 739, 740, 741
See application file for complete search history.

(56) References Cited

U.S. PATENT DOCUMENTS 5,558,540 A * 9/1996 Kato et al. .................. 439/637
5,884,393 A * 3/1999 Miyazawa .................... 29/739
6,928,727 B2 * 8/2005 Ashman et al. ............... 29/843

* cited by examiner

*Primary Examiner*—Neil Abrams
(74) *Attorney, Agent, or Firm*—Charles S. Cohen

(57) ABSTRACT

A system and method are provided for arranging and mounting a plurality of connectors on a substrate in a rectangular or square configuration. The system involves the provision of a rectangular mounting frame having four elongated sides joined at four corners, with engagement means at each corner on one face of the frame. Four elongated connectors are assembled to the one face of the frame respectively along the four elongated sides thereof. The four connectors have complementary engagement means at opposite ends thereof for interengagement with the engagement means at the four corners of the frame to hold the connectors on the frame. A flat surface at the center of the frame may be used to apply suction to manipulate the frame to position the connectors on the substrate. A plurality of terminals are mounted on each connector for electrical connection to appropriate conductors on the substrate, whereafter the mounting frame can be disengaged and removed from the connectors.

15 Claims, 6 Drawing Sheets

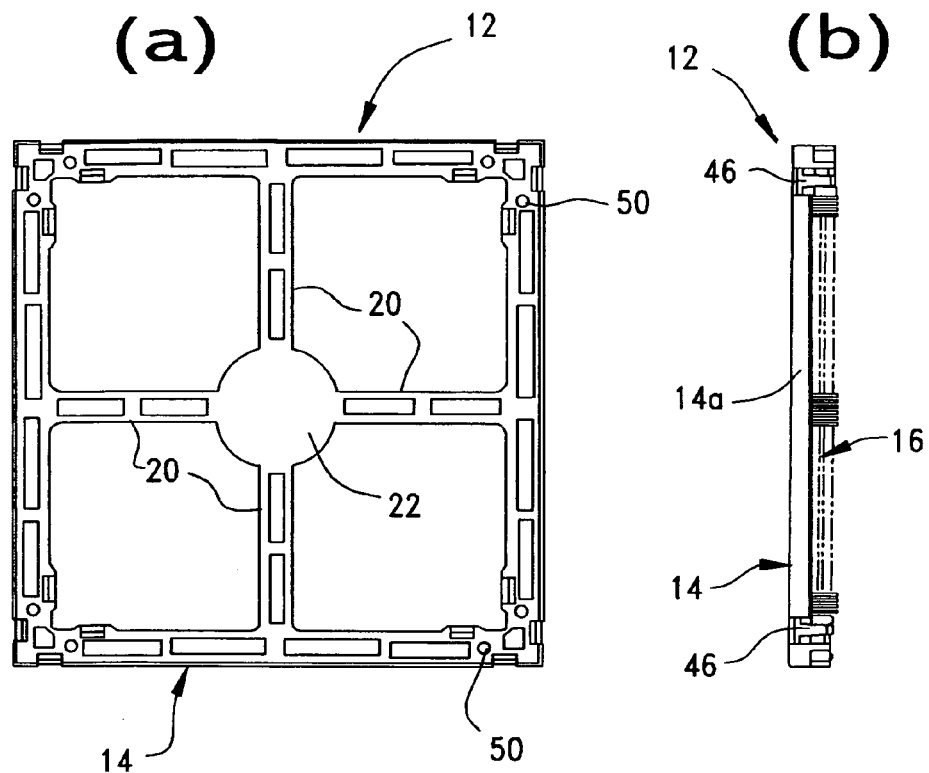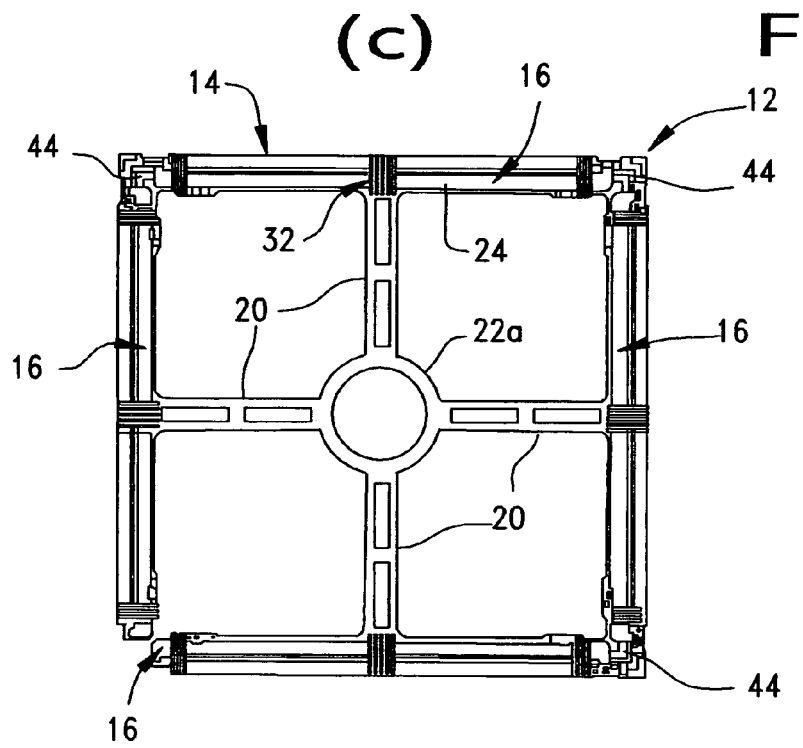
FIG. 1

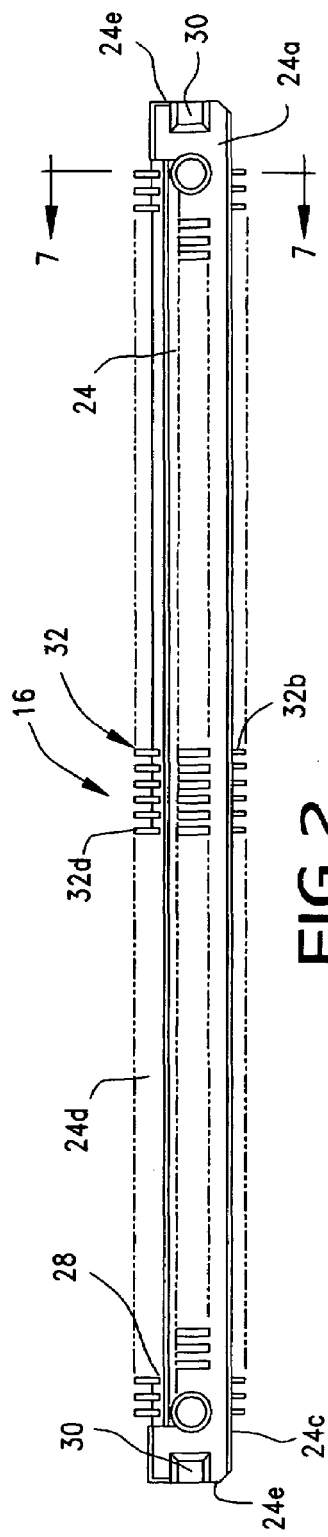
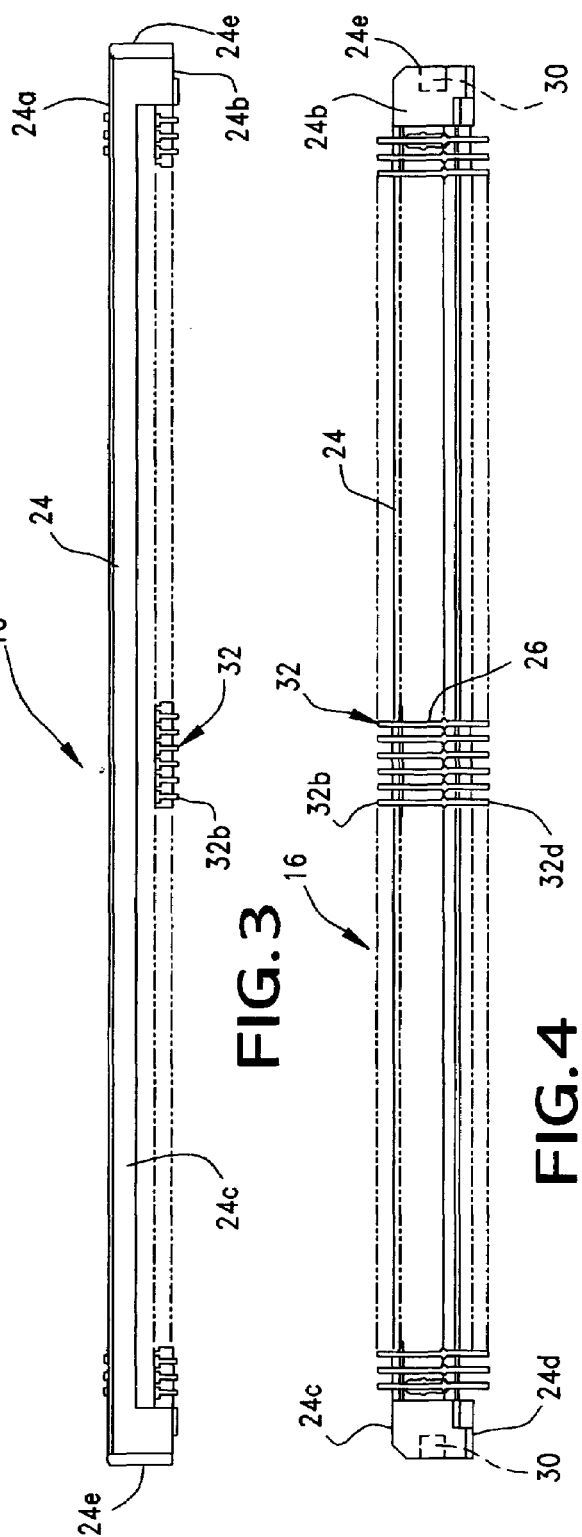

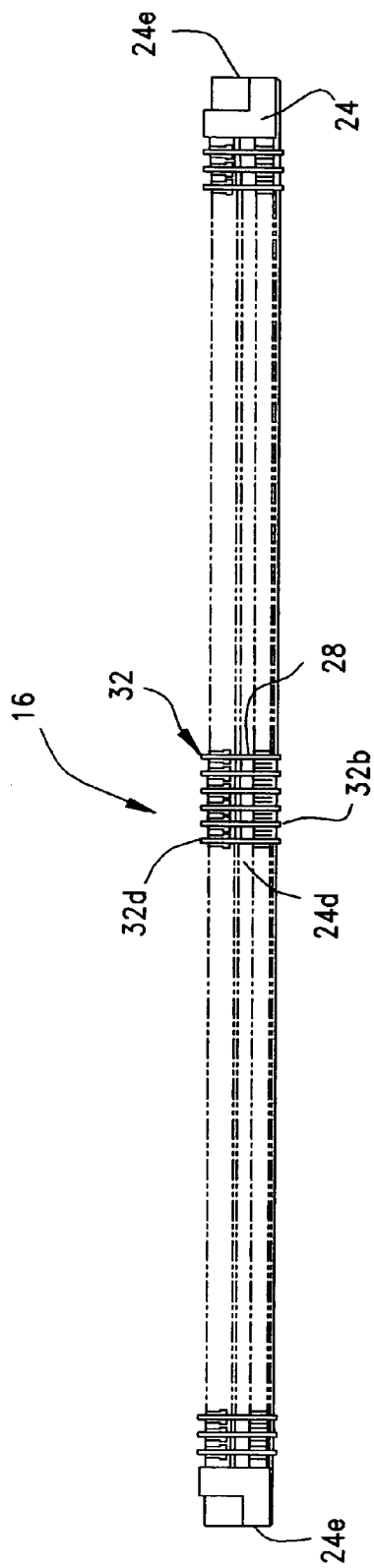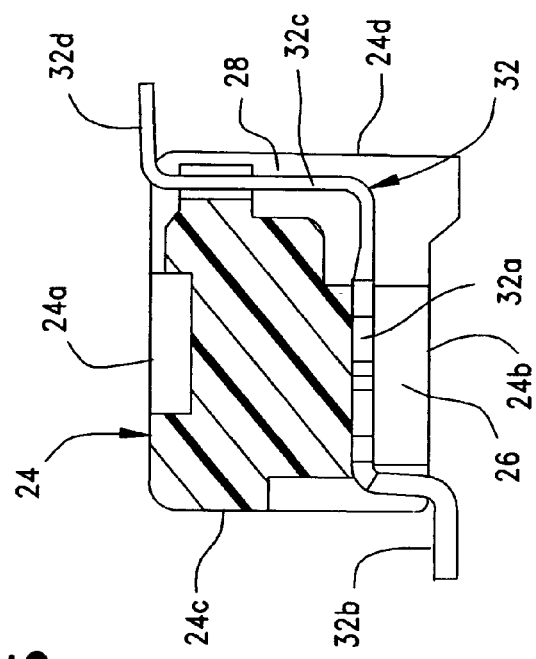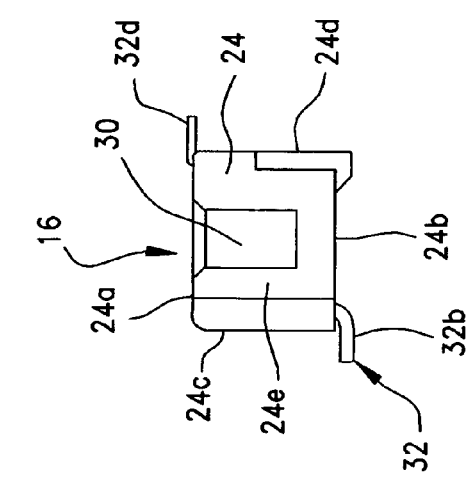

CONNECTOR MOUNTING SYSTEM

FIELD OF THE INVENTION

This invention generally relates to the art of electrical connectors and, particularly, to a system and method for arranging and mounting a plurality of connectors on a substrate, such as a printed circuit board, in a rectangular or square configuration.

BACKGROUND OF THE INVENTION

There are applications wherein it is desirable to fixedly mount and terminate a plurality of electrical terminals to a substrate, such as a printed circuit board, in a rectangular or square configuration, with the terminals in a straight line on each side of the square shape. Heretofore, one system for mounting the terminals has involved the use of a square board fixed to the substrate, with the terminals being disposed along the four edges of the board and soldered to appropriate circuit traces on the substrate. Problems are encountered with such systems when one side of the square board is bent. The terminals along the bent side of the board will undergo undesirable stresses, deteriorating or damaging the solder connections between the terminals and the flat substrate. Often, the opposite side of the square board also becomes bent, resulting in additional deterioration or damage to the terminal connections. As a result, the entire board, all of the terminals and, sometimes, the substrate must be discarded, lowering the yield of final products.

Another system has involved the use of four linear terminal supports forming the square configuration, with the electrical terminals disposed along a substantial length of each terminal support. The ends of the linear terminal supports have projections for interengaging the supports in a square configuration. The terminals then are soldered to the underlying substrate. Such a system can be seen in Japanese Patent 2750998. This system also has problems in that the interengaging projections at the corners of the linear supports occupy a substantial space or "real estate" on the substrate, resulting in lowering the density with which various electrical components can be mounted on the substrate.

The present invention is directed to solving these problems by providing a system which is free of any distortion in the linear terminal arrangement and which can effectively increase the parts-mounting density on a given substrate.

SUMMARY OF THE INVENTION

An object, therefore, of the invention is to provide a new and improved system and method for mounting a plurality of electrical terminals on a substrate, such as a printed circuit board, in a rectangular or square configuration.

In the exemplary embodiment of the invention, a system and method are provided for arranging and mounting a plurality of connectors on a substrate in a rectangular or square configuration. The system involves the provision of a rectangular mounting frame having four elongated sides joined at four corners, with engagement means at each corner on one face of the frame. Four elongated connectors are assembled to the one face of the mounting frame respectively along the four elongated sides thereof. The four connectors have complementary engagement means at opposite ends thereof for interengagement with the engagement means at the four corners of the frame to hold the connectors on the frame. A plurality of terminals are mounted on each connector for electrical connection to appropriate conductors on the substrate, whereafter the frame can be disengaged and removed from the connectors.

According to one aspect of the invention, the engagement means on the mounting frame comprises an L-shaped engagement projection defining right-angled legs. The complementary engagement means on the connectors comprise grooves for receiving the legs. The engagement means on the frame also include latch hooks for holding the connectors on the one face of the frame to facilitate mounting the connector on the substrate.

According to another aspect of the invention, the mounting frame includes a plurality of through holes. An appropriate tool can be inserted through the holes to facilitate separating the frame from the connectors.

According to a further aspect of the invention, the mounting frame includes cross braces extending between the elongated sides of the frame. The cross braces lead to a central flat suction surface for accommodating an appropriate vacuum pick-up unit for manipulating the frame/connector assembly and placing the assembly on the substrate.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIGS. 1(a), (b) and (c) are top plan, side elevational and bottom plan views, respectively, of the frame/connector assembly according to the invention;

FIG. 2 is a top plan view of one of the elongated connectors of the assembly;

FIG. 3 is an outside elevational view of the connector;

FIG. 4 is a bottom plan view of the connector;

FIG. 5 is an inside elevational view of the connector;

FIG. 6 is an end elevational view of the connector;

FIG. 7 is a vertical section taken generally along line 7—7 in FIG. 2;

DETAILED DESCRIPTION OF THE PREFERRED EMBODIMENT

Figure 12:
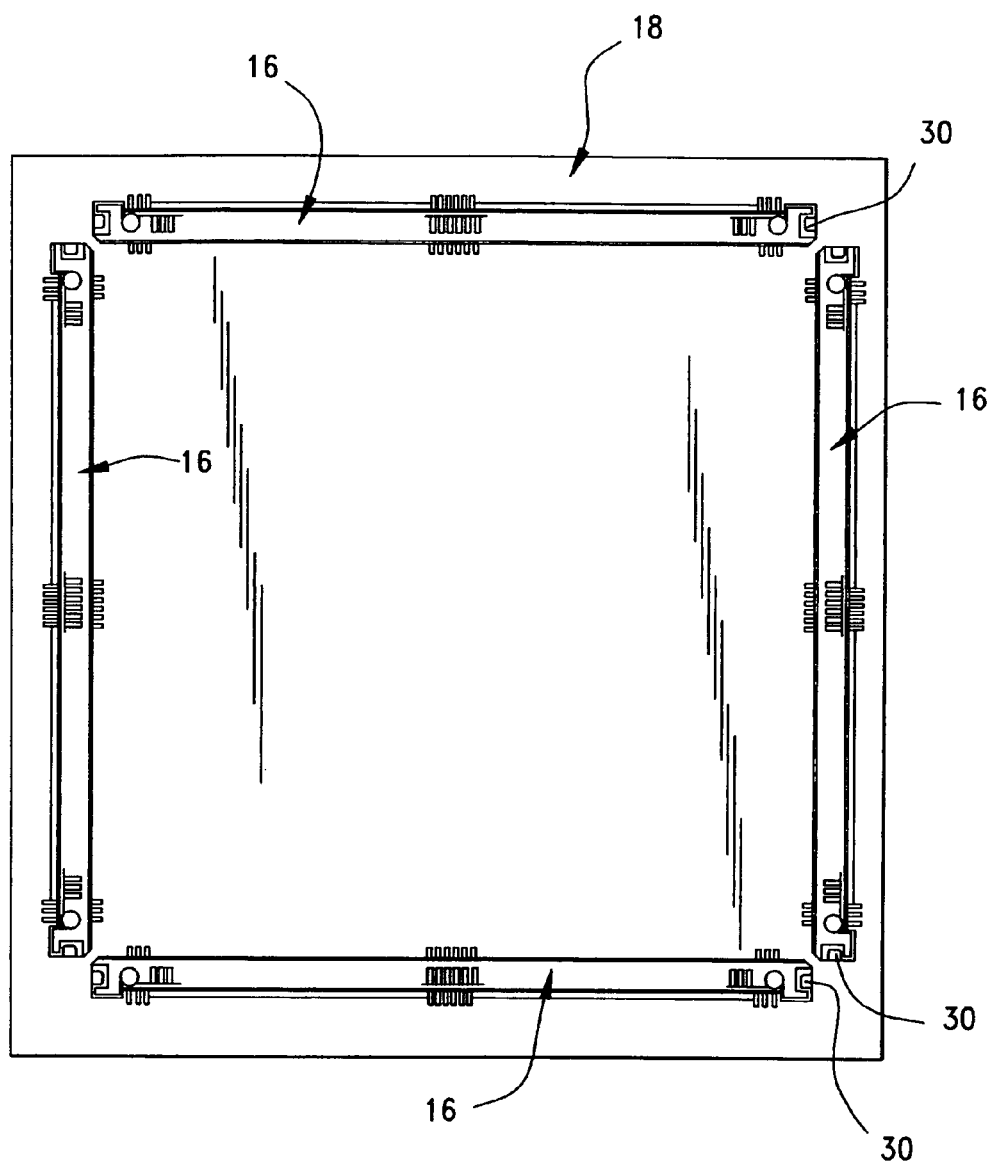
FIG. 12 is a top plan view showing four of the connectors mounted on a substrate in a square configuration, with the frame removed.

Referring to the drawings in greater detail, and first to FIGS. 1(a), 1(b) and 1(c), the invention is embodied in a mounting assembly, generally designated 12, which includes a mounting frame, generally designated 14, and four electrical connectors, generally designated 16, mounted on the frame. The frame is rectangular or square (as shown) in configuration for mounting the four connectors on a substrate, generally designated 18 (FIG. 12), such as a printed circuit board, with the connectors in a square configuration or array. The frame has a plurality (four) of spoke-like cross braces 20 which lead to a central flat suction surface 22 for accommodating an appropriate vacuum pick-up unit which can be used to place assembly 12 on the substrate.

Referring to FIGS. 2–7 in conjunction with FIGS. 1(a)–(c), each electrical connector 16 includes an elongated or linear body or terminal support 24 which is a one-piece structure unitarily molded of dielectric material such as plastic or the like. The elongated terminal support includes a top surface 24a, a bottom surface 24b, a front surface 24c, a rear surface 24d and opposite end surfaces 24e. The terminal support has a plurality of terminal-mounting grooves 26 (FIGS. 4 and 7) in the bottom surface of the support, along with a plurality of terminal-aligning grooves 28 in the rear surface of the support. Each opposite end of terminal support 24 has an engagement means in the form of an engagement groove 30 formed in top surface 24a of the support. The engagement grooves are open at the ends of the support as best seen in FIG. 6.

A plurality of conductive terminals 32 are mounted in a side-by-side, generally parallel arrangement longitudinally of terminal support 24 and along substantially the entire length of the support. As best seen in FIG. 7, each terminal 32 includes a base or body portion 32a which is mounted within a respective one of the terminal-mounting grooves 26 in bottom surface 24d of the terminal support. Opposite side edges of body portion 32a may have teeth for skiving into the plastic material of the terminal support at the opposite walls of groove 26. A solder tail portion 32b projects from one end of body portion 32a for solder connector to an appropriate circuit trace on printed circuit board 18. An L-shaped leg portion 32c projects upwardly from the opposite end of body portion 32a and is disposed within a respective one of the alignment grooves 28 in rear surface 24d of the terminal support. Leg portion 32c terminates in a contact portion 32d which projects inwardly from the rear surface of the terminal support.

Referring to FIGS. 8–11, mounting frame 14 has a square configuration and includes four elongated or linear sides 14a which are joined at four corners 14b. The spoke-like cross braces 20 project inwardly to the flat surface 22 generally from the mid-points of sides 14a of the frame. The flat surface is in the form of a disc-like suction plate 22a which is located at a central point of the frame for accommodating the vacuum pick-up unit. The cross braces have top surfaces 20a and bottom surfaces 20b. The top and bottom surfaces of the braces, as well as the bottom surface of suction plate 22a, are recessed, as at 34 (FIG. 9) to save material and to reduce the overall weight of the frame. Similarly, the top and bottom surfaces of sides 14a of the frame are recessed, as at 36, for the same reasons.

Figure 8:
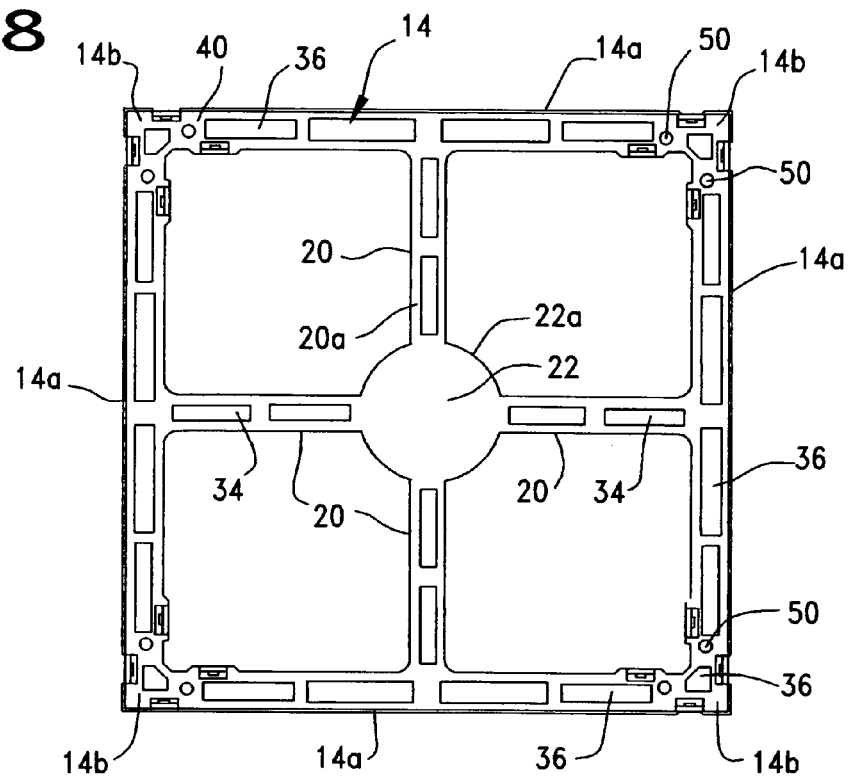
FIG. 8 is a top plan view of the mounting frame.
Figure 9:
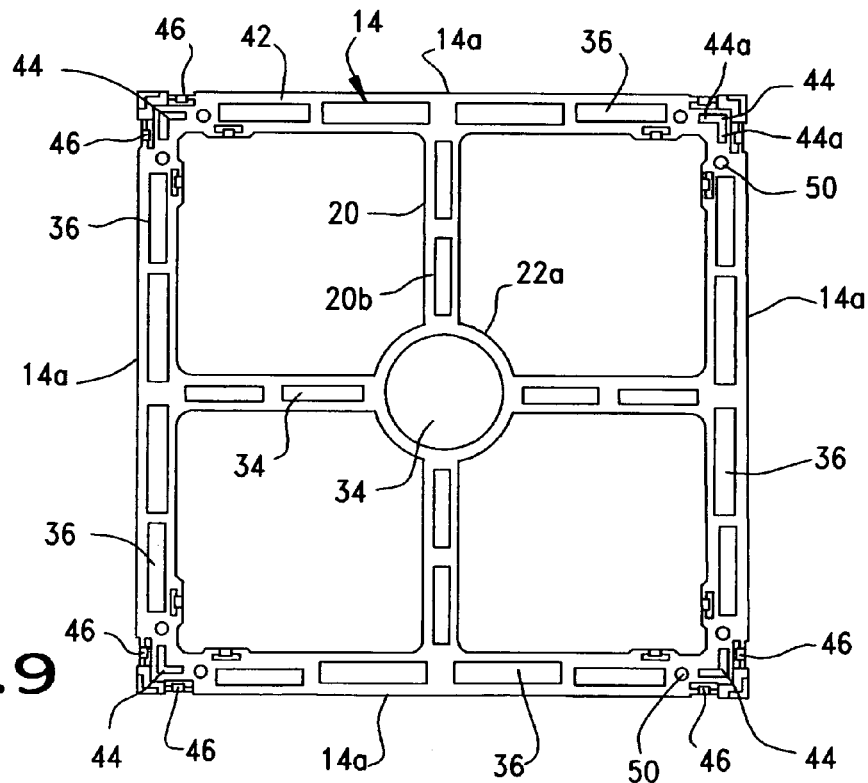
FIG. 9 is a bottom plan view of the frame.
Figure 10:
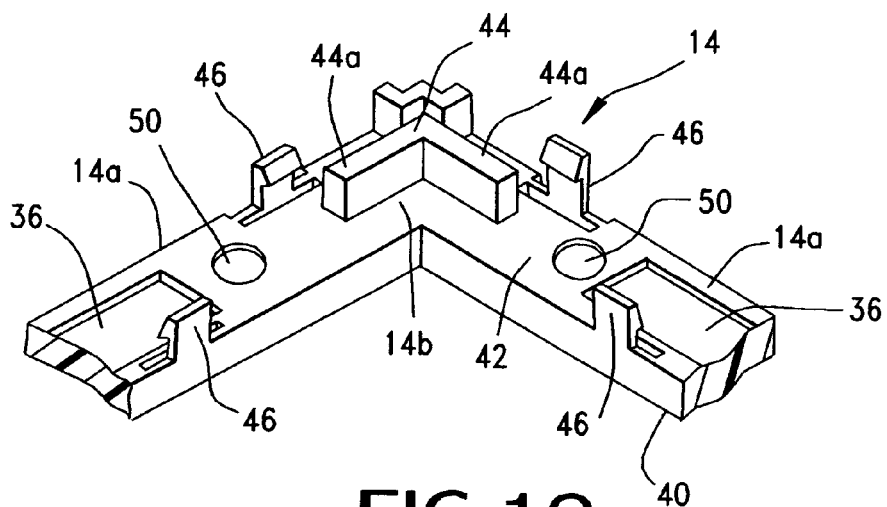
FIG. 10 is an enlarged, fragmented perspective view of one corner of the frame at the top face thereof.
Figure 11:
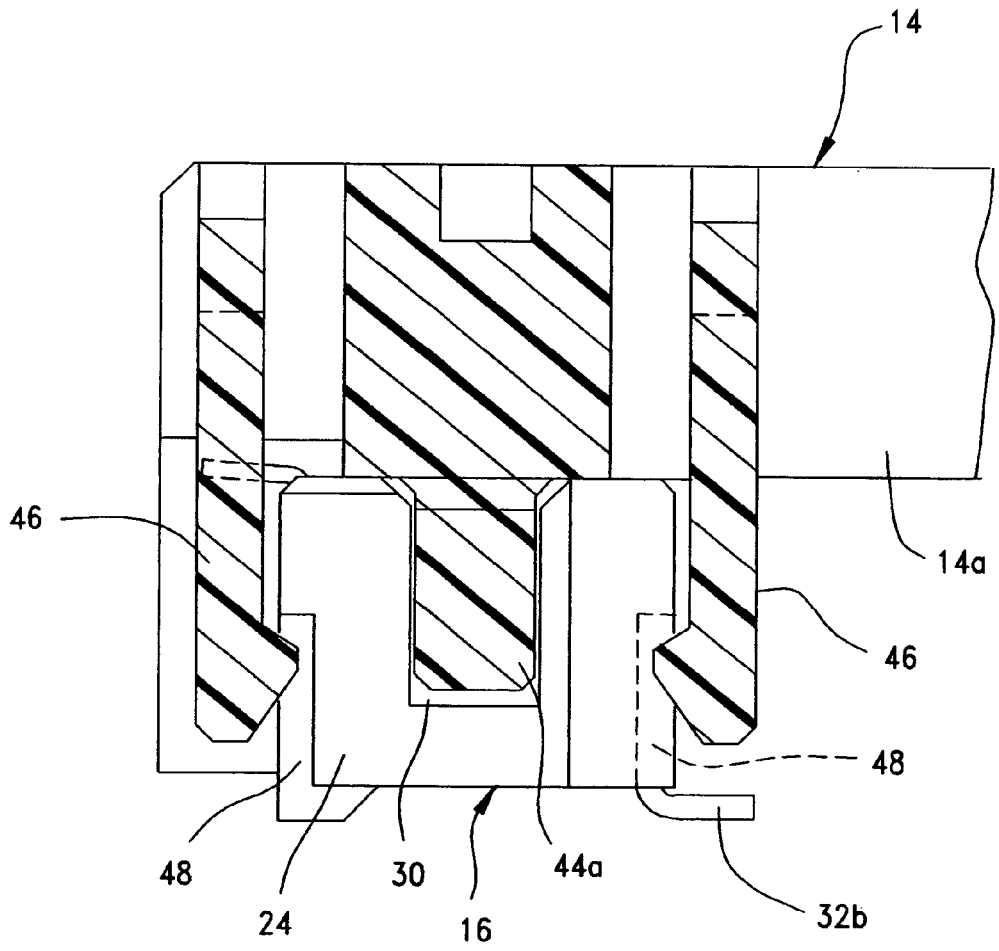
FIG. 11 is an enlarged cross-section through the complementary interengaging means between the frame and one of the connectors.

The outer periphery of mounting frame 14 formed by the four sides 14a of the frame includes a top surface 40 and a bottom surface 42. Generally, engagement means are provided on the bottom surface at each of the four corners 14b of the frame for interengagement with the complementary engagement means (grooves 30) of connectors 16 to hold the connectors on the frame. Specifically, referring to FIG. 10, an L-shaped engagement projection 44 projects from bottom surface 42 at each corner 14b of the frame. The engagement projection defines right-angled engagement legs 44a. When electrical connectors 16 are mounted on the frame, legs 44a of the L-shaped engagement projection are interengaged within engagement grooves 30 at the ends of the adjoining connectors 16 as seen in FIG. 11.

Again referring to FIG. 10, the engagement means at each corner 14b of frame 14 also includes a plurality of latch hooks 46 which project from bottom surface 42 near each corner 14b of the frame. The latch hooks are flexible and, as seen in FIG. 11, the latch hooks "snap" into latching engagement within a plurality of engagement recesses 48 in opposite sides of terminal support 24 of connectors 18.

The use of the connector mounting system of the invention now will be described. A single mounting frame 14 first is provided, and four electrical connectors 16 are mounted to the frame to form mounting assembly 12 as shown in FIGS. 1(a)–(c). The connectors are engaged with and held onto the bottom of the frame as shown in FIG. 11 and as described above in relation to the engagement means of FIGS. 10 and 11. A vacuum pick-up unit then is used to apply suction to flat surface 22 at the center of the frame to manipulate and move mounting assembly 12 onto the top of a substrate such as printed circuit board 18 in FIG. 12. Once the mounting assembly is manipulated to properly position connectors 16 on the printed circuit board, tail portions 32b (FIG. 7) of terminals 32 are solder connected to appropriate circuit traces on the printed circuit board. Mounting frame 14 then is removed from the connectors to leave the connectors in the square configuration shown in FIG. 12.

In order to facilitate removing the frame from the connectors, through holes 50 (FIGS. 8–10) are provided in frame 14. An appropriate pin-like tool can be inserted through holes 50 to engage the top surfaces of terminal supports 24 of connectors 16 to apply a counter-acting force to the connector(s) as the frame is pulled off of the connector(s), thereby preventing any pulling forces from being applied to the solder connections of the terminals. The terminal supports of the four connectors are independent of each other and, therefore, even if one of the supports is bent or twisted, the other supports will not be affected.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A system for arranging and mounting a plurality of connectors on a substrate in a rectangular configuration, comprising:

a rectangular mounting frame having four elongated sides joined at four corners, with engagement means at each corner on one face of the frame; and four elongated connectors assembled to the one face of the frame respectively along the four elongated sides thereof, the four connectors having complementary engagement means at opposite ends thereof for interengagement with the engagement means at the four corners of the frame to hold the connectors on the frame, and including a plurality of terminals on each connector for electrical connection to appropriate conductors on the substrate whereafter the frame can be disengaged and removed from the connectors.

2. The system of claim 1 wherein said engagement means on the mounting frame comprises an L-shaped engagement projection defining right-angled engagement legs, and the complementary engagement means on the connectors comprise engagement grooves for receiving the legs.

3. The system of claim 1 wherein said engagement means on the mounting frame include latch hooks for holding the connectors on the one face of the frame.

4. The system of claim 1 wherein said mounting frame includes a plurality of through holes for receiving an appropriate tool to facilitate separating the frame from the underlying connectors.

5. The system of claim 1 wherein said mounting frame includes cross braces extending between the elongated sides of the frame.

6. The system of claim 5 wherein said cross braces lead to a central flat surface for accommodating an appropriate vacuum pick-up unit.

7. A system for arranging and mounting a plurality of connectors on a substrate in a rectangular configuration, comprising:
 a rectangular mounting frame having four elongated sides joined at four corners, an L-shaped engagement projection at each corner on one face of the frame, the engagement projection defining right-angled engagement legs, and a plurality of latch hooks projecting from the one face of the frame; and
 four elongated connectors assembled to the one face of the frame respectively along the four elongated sides thereof, the four connectors having engagement grooves at opposite ends thereof for receiving the engagement legs of the L-shaped engagement projection at the four corners of the frame, the connectors being engageable with the latch hooks of the frame for holding the connectors on the one face of the frame, and including a plurality of terminals on each connector for electrical connection to appropriate conductors on the substrate whereafter the frame can be disengaged and removed from the connectors.

8. The system of claim 7 wherein said mounting frame includes a plurality of through holes for receiving an appropriate tool to facilitate separating the frame from the underlying connectors.

9. The system of claim 7 wherein said mounting frame includes cross braces extending between the elongated sides of the frame.

10. The system of claim 9 wherein said cross braces lead to a central flat surface for accommodating an appropriate vacuum pick-up unit.

11. They system of claim 7 wherein said connectors include engagement recesses for receiving the latch hooks of the frame.

12. A method for arranging and mounting a plurality of connectors on a substrate in a rectangular configuration, comprising:
 providing a rectangular mounting frame having four elongated sides joined at four corners;
 mounting four elongated connectors to one face of the frame respectively along the four elongated sides thereof, each connector being provided with a plurality of terminals;
 connecting the terminals to appropriate conductors on the substrate; and
 removing the frame from the connectors and leaving the connectors on the substrate in a rectangular configuration.

13. The method of claim 12 wherein the mounting frame includes cross braces extending between the elongated sides of the frame and leading to a central flat surface, and including the step of using an appropriate vacuum pick-up unit to apply suction to the flat surface to manipulate and move the frame and connectors onto the substrate.

14. The method of claim 12 wherein the mounting frame includes a plurality of through holes, and including the step of using a thrust tool inserted through the holes to separate the frame from the underlying connectors.

15. The method of claim 12 wherein the mounting frame is provided with engagement means at each corner thereof and the four connectors are provided with complementary engagement means at opposite ends thereof, and including the step of interengaging said engagement means to mount the four connectors to the frame.

* * * * *